United States Patent
Hong et al.

(10) Patent No.: US 10,229,834 B2
(45) Date of Patent: Mar. 12, 2019

(54) METHOD FOR MANUFACTURING NONVOLATILE MEMORY THIN FILM DEVICE BY USING NEUTRAL PARTICLE BEAM GENERATION APPARATUS

(71) Applicant: KOREA UNIVERSITY RESEARCH AND BUSINESS FOUNDATION, Seoul (KR)

(72) Inventors: Mun Pyo Hong, Gyeonggi-do (KR); Jin Nyeong Jang, Sejong (KR)

(73) Assignee: KOREA UNIVERSITY RESEARCH AND BUSINESS FOUNDATION, SEJONG CAMPUS, Sejong-si (KR)

( * ) Notice: Subject to any disclaimer, the term of this patent is extended or adjusted under 35 U.S.C. 154(b) by 0 days.

(21) Appl. No.: 15/517,532

(22) PCT Filed: Oct. 8, 2015

(86) PCT No.: PCT/KR2015/010671
§ 371 (c)(1),
(2) Date: Apr. 7, 2017

(87) PCT Pub. No.: WO2016/056862
PCT Pub. Date: Apr. 14, 2016

(65) Prior Publication Data
US 2017/0301547 A1    Oct. 19, 2017

(30) Foreign Application Priority Data
Oct. 10, 2014 (KR) .................. 10-2014-0136931

(51) Int. Cl.
*H01L 21/28* (2006.01)
*H01L 21/425* (2006.01)
(Continued)

(52) U.S. Cl.
CPC ...... *H01L 21/28282* (2013.01); *H01L 21/263* (2013.01); *H01L 21/425* (2013.01); *H05H 1/46* (2013.01)

(58) Field of Classification Search
None
See application file for complete search history.

(56) References Cited

U.S. PATENT DOCUMENTS 7,332,382 B2    2/2008    Han
7,919,142 B2    4/2011    Yeom et al.
(Continued)

FOREIGN PATENT DOCUMENTS

KR    10-2006-0102043    9/2006
KR    10-2010-0105194    9/2010
(Continued)

OTHER PUBLICATIONS

Jang et al.,"Nonvolatile Memory Device Using Mobile Protons via Insertion Hydrogen Neutral Beam Treatment Process between SiO2 Deposition Processes at Room Temperature", ECS Transactions, vol. 64, No. 10, pp. 181-186, Oct. 8, 2014.*
(Continued)

*Primary Examiner* — Andres Munoz
(74) *Attorney, Agent, or Firm* — Hauptman Ham, LLP

(57) ABSTRACT

The present invention relates to a method for manufacturing a nonvolatile memory thin film device by using a neutral particle beam generation apparatus. The present invention solves the problem that substrates such as glass and a plastic film may not be used for manufacturing the memory thin film device due to the high temperature heat treatment process for a long time, in the existing method for manufacturing the thin film device having the nonvolatile memory function by forming the mobile proton layer.

2 Claims, 7 Drawing Sheets

(51) Int. Cl.
 *H05H 1/46* (2006.01)
 *H01L 21/263* (2006.01)

(56) References Cited

U.S. PATENT DOCUMENTS

| | | |
|---|---|---|
| 8,680,525 B2 | 3/2014 | Han |
| 2006/0079042 A1 | 4/2006 | Han |
| 2006/0213443 A1 | 9/2006 | Yeom et al. |
| 2008/0105876 A1 | 5/2008 | Han |
| 2011/0162581 A1 | 7/2011 | Yeom et al. |

FOREIGN PATENT DOCUMENTS

| | | |
|---|---|---|
| KR | 10-2012-0058841 | 6/2012 |
| KR | 10-2014-0003684 | 1/2014 |

OTHER PUBLICATIONS

Lee et al., "Influence of argon neutral beam energy on the structural properties of amorphous carbon thin films grown by neutral particle beam assisted sputtering", Thin Solid Films 519 (2011) 6703-6707.*

European Patent Office Search Report. Application: EP 15 848 274.5. Published: May 9, 2018.*

International Search Report for corresponding International PCT Application No. PCT/KR2015/010671, dated Jan. 21, 2016.

* cited by examiner

FIG.2
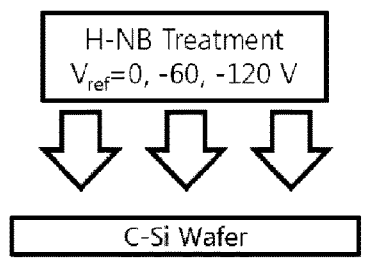
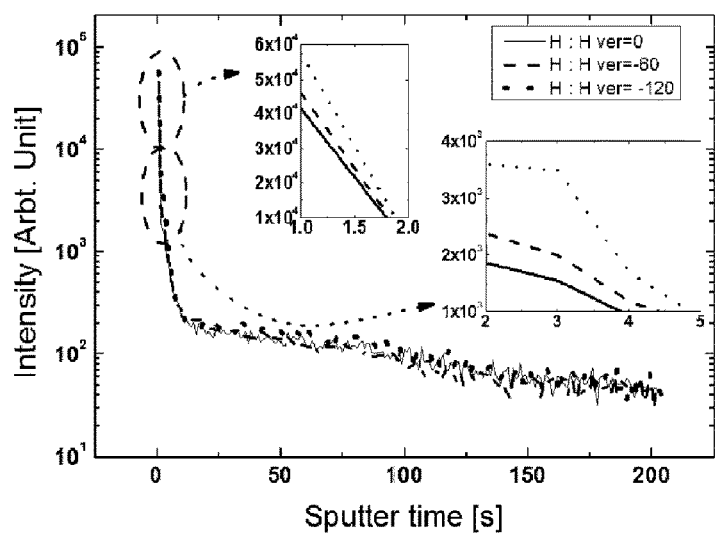

METHOD FOR MANUFACTURING NONVOLATILE MEMORY THIN FILM DEVICE BY USING NEUTRAL PARTICLE BEAM GENERATION APPARATUS

TECHNICAL FIELD

The present invention relates to a method for manufacturing a nonvolatile memory thin film device using a neutral particle beam generation apparatus.

BACKGROUND ART

As described in Patent Document 1, the existing method for generating mobile protons and manufacturing a memory device based on the generated mobile protons requires a high-temperature hydrogen heat treatment process for a long time (tens of minutes or more) and 600° C. or more.

Accordingly, the existing method for manufacturing a memory device has a problem that substrates such as glass and a plastic film may not be used for manufacturing a memory device because of the complicated process and the high-temperature heat treatment process for a long time. In addition, the existing method for manufacturing a memory device has a problem in that there are restrictions on a selection of a semiconductor layer material and the heat treatment process because the hydrogen heat treatment process is performed after the semiconductor layer is formed.

Therefore, there is a need for a new method for generating mobile protons without a hydrogen heat treatment process and manufacturing a memory device based on the generated mobile protons.

DISCLOSURE

Technical Problem

An object of the present invention is to provide a method for manufacturing a nonvolatile memory thin film device using a neutral particle beam generation apparatus capable of forming a mobile proton layer at a low temperature of 300° C. or less in a short time.

Technical Solution

In one general aspect, a method for manufacturing a nonvolatile memory thin film device by using a neutral particle beam generation apparatus including a chamber, which is a plasma discharge space and has a predetermined size, a gas supply port for supplying gas to the inside of the chamber, and a reflector colliding with plasma ions generated in the chamber so as to convert the plasma ions into neutral particles, the method includes: arranging, in the chamber, a substrate on which a first insulating film is formed; supplying, to the inside of the chamber, hydrogen gas for generating hydrogen plasma and inert gas for generating plasma through the gas supply port; converting hydrogen plasma ions generated in the chamber into hydrogen neutral particles by colliding the hydrogen plasma ions with the reflector; forming a mobile proton layer by accumulating the hydrogen neutral particles on a surface of the first insulating film; and forming a second insulating film on the mobile proton layer.

The reflector of the neutral particle beam generation apparatus may be a solid plate composed of particles heavier than the hydrogen particles of the hydrogen gas and lighter than the inert particles of the inert gas.

Advantageous Effects

The method for manufacturing a nonvolatile memory thin film device using the neutral particle beam generation apparatus according to the present invention may form the mobile proton layer at a temperature of 300° C. or less, which is a relatively low temperature, in a short time (10 minutes), instead of the high-temperature hydrogen heat treatment process of 600° C. or more for a long time (tens of minutes or more) like the related art.

Further, the present invention may utilize the process sequence of the existing memory thin film device production line as it is by adding only the mobile proton layer forming process using the neutral particle beam generation apparatus during the insulating film deposition process for manufacturing a nonvolatile memory thin film device.

Further, the present invention solves the problem that substrates such as glass and a plastic film may not be used for manufacturing the memory thin film device due to the high temperature heat treatment process for a long time, in the existing method for manufacturing the thin film device having the nonvolatile memory function by forming the mobile proton layer.

Therefore, the present invention may manufacture the high-performance nonvolatile memory thin film device on the glass or plastic substrate to be directly applied to flexible devices or wearable devices which are next-generation ITC products and may also manufacture new concept products (ultra-low power flexible/wearable displays, sensors, etc.) that may not be realized due to the current technical limitations.

DESCRIPTION OF DRAWINGS

FIG. 2 is a view illustrating measurement results of a hydrogen element density after a mobile proton layer is formed on a single crystal silicon wafer substrate.

BEST MODE

Hereinafter, the present disclosure will be described in more detail with reference to accompanying drawings. A detailed description for well-known functions and configurations that may obscure the gist of the present invention will be omitted.

Figure 1:
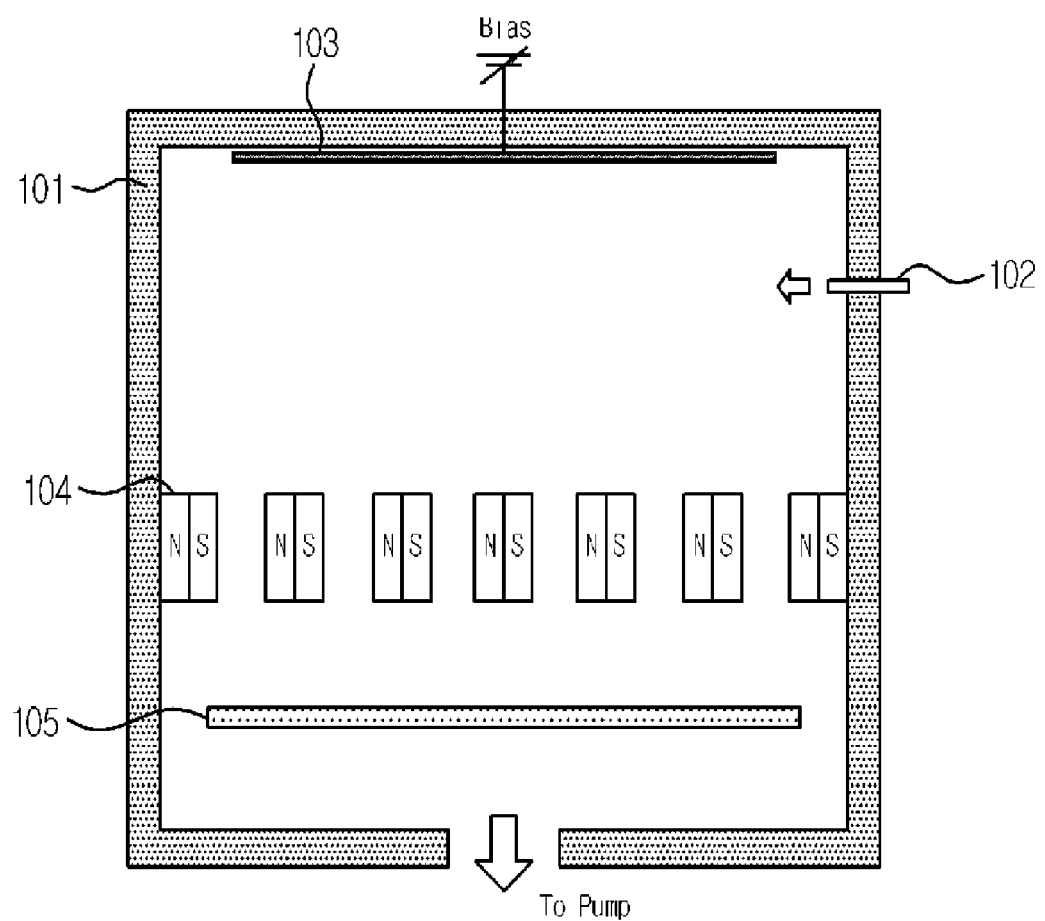
FIG. 1 is a schematic view illustrating an example of a neutral particle beam generation apparatus.

FIG. 1 is a schematic view illustrating an example of a neutral particle beam generation apparatus.

Referring to FIG. 1, the neutral particle beam generation apparatus includes a chamber 101 which is a plasma discharge space and has a predetermined size.

One side of the chamber 101 is provided with a gas supply port 102, in which the gas supply port 102 may be supplied with gas for plasma formation or source gas for supplying gas element, or the like. A position of the gas supply port 102 may be changed for plasma generation uniformity.

An upper end of the chamber 101 is provided with a solid plate which is a reflector 103. The reflector 103 is applied with a predetermined bias to generate neutral particles from plasma particles.

A lower end of the chamber 101 is provided with a support 105 for supporting the substrate.

Further, a plurality of magnetic array limiters 104 are disposed inside the chamber 101. The magnet array limiter 104 serves to block electrons and other ions present in the plasma discharge space from approaching the substrate and selectively transmit only the neutral particles toward the substrate. The magnet array limiter 104 may or may not be installed in the chamber 101.

The method for manufacturing a nonvolatile memory thin film device according to the present invention includes a method for forming mobile protons using a neutral particle beam generation apparatus as illustrated in FIG. 1, which accumulates hydrogen neutral particles between a first insulating film and a second insulating film at a temperature of 300° C. or less, which is a relatively low temperature, in a short time (10 minutes) to form the mobile protons, unlike the existing method for forming mobile protons by injecting hydrogen into an insulating film using a high-temperature (600° C. or more) heat treatment process.

Describing the method for forming mobile protons according to an exemplary embodiment of the present invention, first, the substrate on which a mobile proton layer is to be formed is disposed on the support 105 of the neutral particle beam generation apparatus.

For example, in order to implement the memory device utilizing the characteristics that the mobile protons move in the insulating film according to a voltage applied to a gate electrode, the substrate on which the insulating film is formed thereon may be disposed on the support 105.

Further, the inert gas for generating plasma and hydrogen gas for generating hydrogen plasma are supplied to the plasma discharge space through the gas supply port 102. Here, as the inert gas, gases such as argon (Ar), krypton (Kr), and xenon (Xe) may be used. The inert gas may not be used if plasma discharge may be sufficiently made only by the hydrogen gas.

The inert gas supplied to the gas supply port 102 is plasma discharged to generate plasma particles, and the hydrogen gas collides with the plasma particles in the chamber to become hydrogen plasma ions (or cations).

At this time, a negative bias having about 10 to several hundreds of volts may be applied to the reflector 103, such that the hydrogen plasma ions may be led to the reflector 103.

The hydrogen plasma ions collide with the reflector 103 to receive electrons from the reflector 103 so as to become hydrogen neutral particles, and at the same time receive energy depending on the applied bias to be reflected out.

Further, the hydrogen neutral particles pass between the plurality of magnet array limiters 104 and then accumulate on the surface of the substrate (or insulating film) disposed on the support 105 to form the mobile proton layer. At this time, in addition to the hydrogen neutral particles, the hydrogen plasma ion may also contact the surface of the substrate (or insulating film) to form the mobile proton layer.

Herein, a hydrogen-particle beam (H-PB) is represented as including at least any one of the hydrogen neutral particle and the hydrogen plasma ion.

Meanwhile, the method for manufacturing a nonvolatile memory thin film device according to the present invention is characterized in that the reflector 103 of the neutral particle beam generation apparatus uses the neutral particle beam generation apparatus configured of the solid plate composed of particles heavier than hydrogen particles of hydrogen gas introduced through the gas supply port 102 and lighter than the inert particles of the inert gas.

This is to generate a hydrogen particle beam with high purity. When the collision of particles is interpreted as a binary collision, the reflection efficiency of the colliding particles is good when the colliding particles are lighter than target (here, the reflector 103) particles, but on the contrary, the reflection efficiency of the colliding particles is lowered abruptly when the colliding particles are heavier than the target particles. Therefore, more hydrogen particle beams may be generated in the neutral particle beam generation apparatus in case of using the reflector 103 made of a material heavier than the hydrogen particles but lighter than the inert gas particles.

For example, when hydrogen gas and argon gas are used to irradiate a hydrogen particle beam onto a surface of a silicon oxide film or a silicon nitride film, the reflector of the neutral particle beam generation apparatus is preferably a silicon plate.

The method for manufacturing a nonvolatile memory thin film device using a neutral particle beam generation apparatus according to the present invention may also form the mobile proton layer on the substrate (or insulating film) at a low temperature of 300° C. or less in a short time (10 minutes) without a high-temperature (600° C. or more) heat treatment process.

FIG. 2 is a graph illustrating measurement results of a hydrogen element density after a mobile proton layer is formed on a single crystal silicon wafer substrate.

Referring to FIG. 2, it can be seen that, in the case of forming the mobile protons according to the present invention, as a reflector voltage $V_{ref}$ of the neutral particle beam generation apparatus is increased, a hydrogen density on the surface of the substrate is getting increased. That is, as the reflector voltage is increased, hydrogen particles having higher chemical potential are getting diffused on the surface and accumulated on the surface, such that a larger amount of hydrogen is accumulated in a few Å region of the surface of the substrate.

Figure 3:
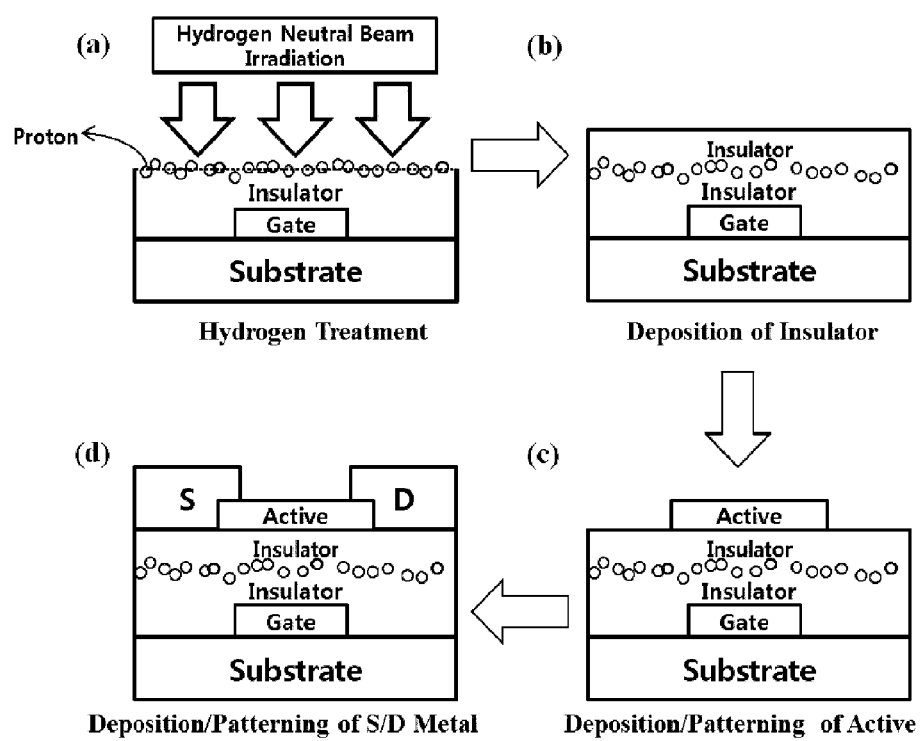
FIG. 3 is a view illustrating a method for manufacturing a nonvolatile memory thin film device according to an exemplary embodiment of the present invention.

FIG. 3 is a view illustrating a method for manufacturing a nonvolatile memory thin film device according to an exemplary embodiment of the present invention. More specifically, FIG. 3 illustrates an example of a process of manufacturing an inverted staggered thin film transistor among nonvolatile memory thin film devices. However, the present invention is not limited only to the process for manufacturing an inverted staggered thin film transistor. In manufacturing the device having the structure (i.e., substrate, insulating film, mobile proton layer) of the nonvolatile memory thin film device manufactured according to the present invention, the same technical idea describing the inverted staggered thin film transistor to be described later may be applied.

The present invention provides the method for manufacturing a thin film device having a nonvolatile memory function by forming the mobile proton layer in the insulating film, for example, moving the mobile protons within the insulating film when a voltage is applied to a gate electrode.

Referring to FIG. 3, in step (a), after the gate electrode is formed on the substrate and the first insulating film is formed on the substrate, the substrate on which the first insulating film is formed is disposed in the chamber which is the plasma discharge space of the neutral particle beam generation apparatus, the hydrogen gas and the inert gas are supplied into the chamber through the gas supply port, the hydrogen plasma ions generated in the chamber collide with the reflector through the plasma discharge to be converted into the hydrogen neutral particles, and the hydrogen neutral particles are accumulated on the surface of the first insulating film to a predetermined amount or more, thereby forming the mobile proton layer. Here, a series of processes in which the mobile proton layer is formed on the surface of the first insulating film is performed at a low temperature of 300° C. or less in a short time (10 minutes).

After the step (a), step (b) is a step of depositing the second insulating film on the formed mobile proton layer by a process like the PECVD, such that the mobile proton layer is formed between the first insulating film and the second insulating film.

Further, after the step (b), steps (c) and (d) that are the general inverted staggered thin film transistor process are sequentially performed, such that the inverted staggered thin film transistor having the nonvolatile memory function according to the exemplary embodiment of the present invention may be manufactured.

Since the method for manufacturing a nonvolatile memory thin film device according to the present invention has a form in which only the process of forming the mobile proton layer is added in the process of forming the insulating film which is performed when manufacturing the existing memory thin film device, in addition to the process of manufacturing the thin film transistor having the inverted staggered structure illustrated in FIG. 3, it may be applied to the process of manufacturing the thin film transistor having all structures such as a staggered structure, a coplanar structure, and an inverted coplanar structure.

Further, the method for manufacturing a nonvolatile memory thin film device according to the present invention is achieved by adding only the process of forming the mobile proton layer using the neutral particle beam generation apparatus to the middle of the insulating film during the process of depositing the insulating film in the existing process of manufacturing an amorphous silicon thin film transistor, a low temperature polysilicon (LTPS) thin film transistor, a transistor using an oxide semiconductor, an organic semiconductor, and all other semiconductor thin films.

It is meaningful that the method for manufacturing a nonvolatile memory thin film device according to the present invention may utilize the process sequence of the existing thin film device production line as it is and the added process of forming the mobile proton layer may also be performed at the low temperature of 300° C. or less in the short time (10 minutes).

FIGS. 4 to 7 are views illustrating characteristics of a nano-crystalline Si thin film transistor (nc-Si TFT) in which a mobile proton layer is formed.

Figure 4:
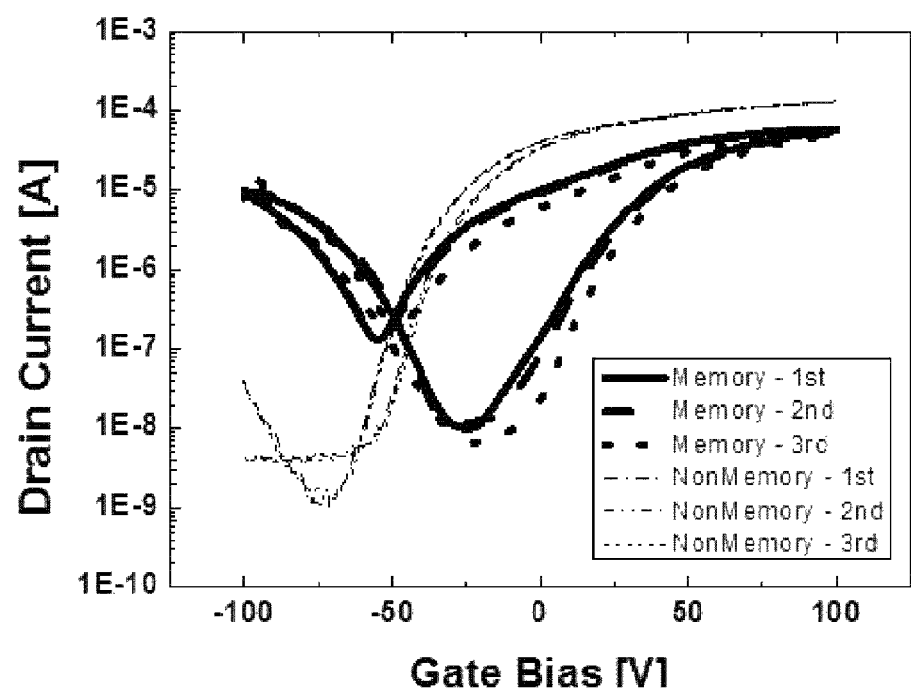
FIGS. 4 to 7 are views illustrating characteristics of a nano-crystalline Si thin film transistor (nc-Si TFT) in which a mobile proton layer is formed.

FIG. 4 illustrates a difference in characteristics between an nc-Si TFT (represented by NonMemory in FIG. 4) in which the mobile proton layer is not formed in the gate insulating film and an nc-Si TFT having a nonvolatile memory function (represented by Memory in FIG. 4) in which the mobile proton layer is formed in the gate insulating film for 2 minutes according to the method according to the present invention.

The nc-Si TFT having the nonvolatile memory function shows hysteresis depending on a sweep of the gate voltage, which is a phenomenon occurring because the mobile protons in the insulating film move to an active film/gate insulating film or a gate insulating film/gate electrode interface depending on the gate voltage.

Figure 5:
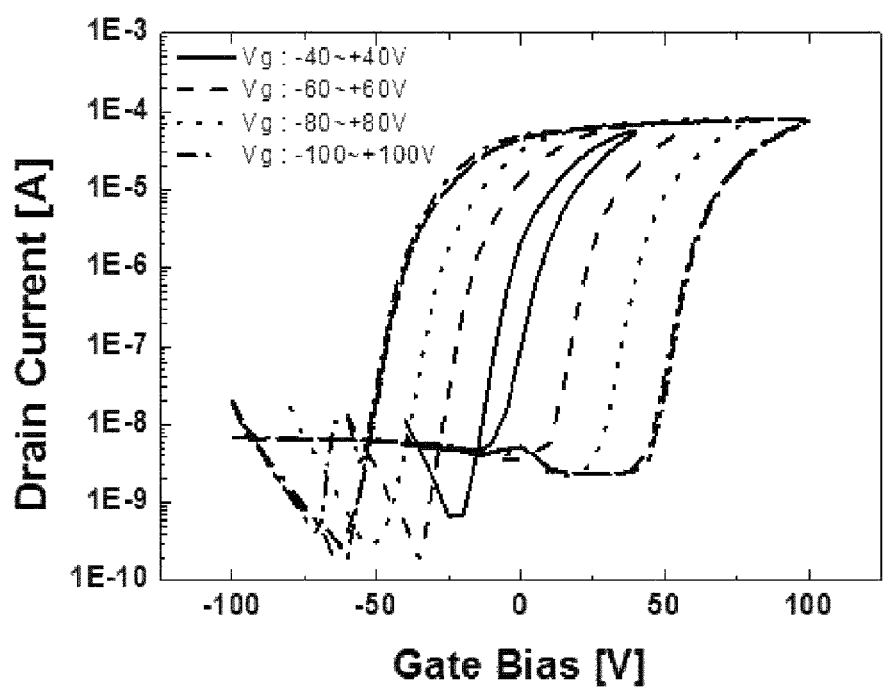
Figure 7:
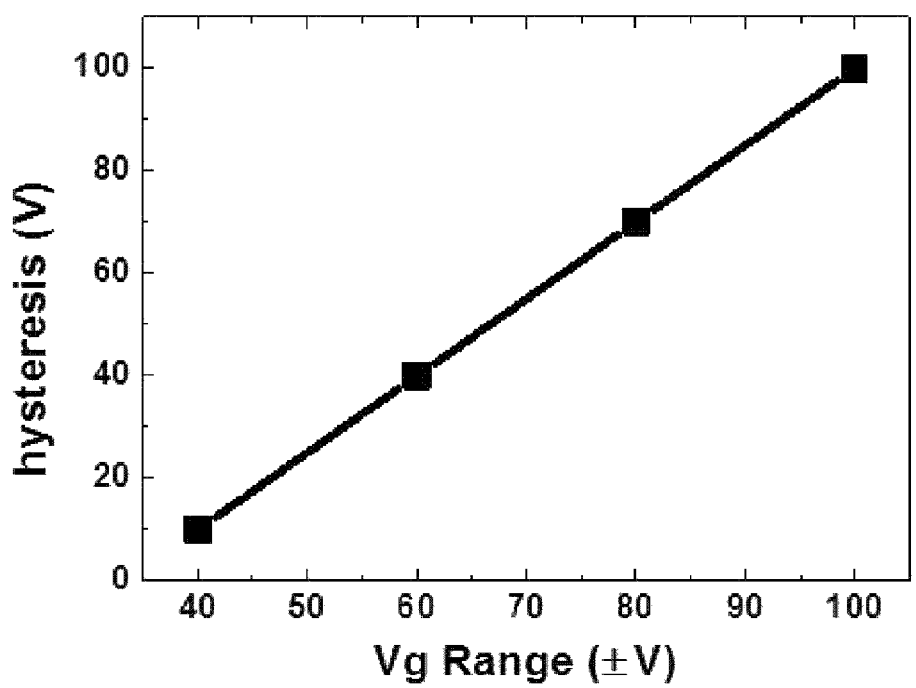

Further, FIGS. 5 and 7 illustrate that a hysteresis magnitude linearly responds to a sweep width of the gate voltage Vg. This shows that the mobile protons inside the insulating film are controlled quantitatively according to the gate voltage.

Figure 6:
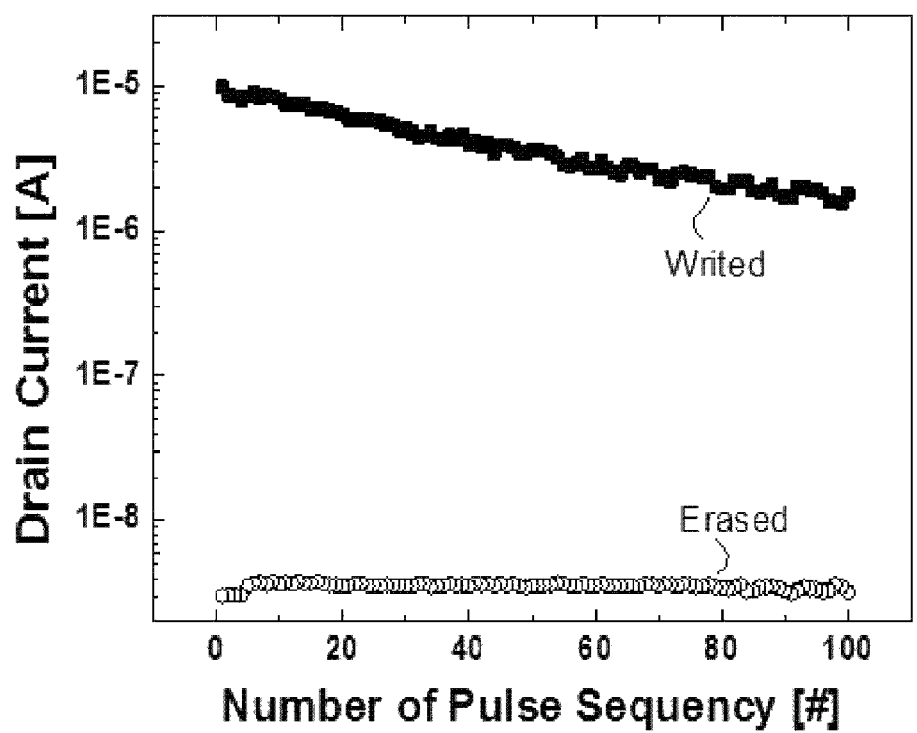

FIG. 6 illustrates measurement results obtained by repeatedly applying write & erase conditions to the nc-Si TFT having the nonvolatile memory function in order to confirm reproducibility of the memory function. Here, a drain current illustrated in FIG. 6 represents a drain current when a drain voltage Vd is 5 V in the write condition, i.e., in the state in which the gate voltage Vg of +100 V is applied for 1 second and then Vg=0 V and represents a drain current when Vd=5 V in the erase condition, i.e., in the state in which the gate voltage of −100 V is applied for 1 second and then Vg=0 V.

FIG. 6 illustrates that the write & erase state is normally operated 100 times. The nc-Si TFT having the nonvolatile memory function manufactured according to the present invention stores the information even if it is left in the write or erase state for several days, and as a result, it can be confirmed that a stable retention time, which is one of core characteristics of the memory device, is secured.

The nonvolatile memory thin film transistor manufactured according to the present invention having characteristics as illustrated in FIGS. 4 to 7 may be very usefully used to implement a low power wearable OLED, for example.

When the thin film transistor having a nonvolatile memory function is used to implement the low power wearable OLED, there is no need to use a storage capacitor for a pixel holding function in an existing driving circuit, and a driving method is also changed, such that power consumption for maintaining an off state of a switching thin film transistor may be completely eliminated. Therefore, the low power operation is possible because there is no storage capacitor and no power is required to maintain the off state of the switching thin film transistor. In addition, since the thin film transistor has the memory function, the existing problems may be solved even in the pixel holding (still image) and the low-speed frame driving. In addition, no storage capacitor is required, and as a result, an area and a contact area are reduced, thereby implementing higher resolution.

As described above, according to the present invention, it is possible to manufacture the nonvolatile memory thin film device at the low temperature of 300° C. or less in a short time (10 minutes), instead of the high temperature hydrogen heat treatment process at 600° C. or more for a long time (tens of minutes or more).

Further, the present invention may utilize the process sequence of the existing thin film device production line as it is by adding only the mobile proton layer forming process using the neutral particle beam generation apparatus during the insulating film deposition process for manufacturing a nonvolatile memory thin film device.

Further, the present invention solves the problem that substrates such as glass and a plastic film may not be used for manufacturing the memory thin film device due to the high temperature heat treatment process for a long time, in the existing method for manufacturing the thin film device having the nonvolatile memory function by forming the mobile proton layer.

Therefore, the present invention may manufacture the high-performance nonvolatile memory thin film device on the glass or plastic substrate to be directly applied to flexible devices or wearable devices which are next-generation ITC products and may also manufacture new concept products (ultra-low power flexible/wearable displays, sensors, etc.) that may not be realized due to the current technical limitations.

Although the present invention has been described with reference to the exemplary embodiments and the accompanying drawings, it is not limited to the above-mentioned exemplary embodiments but may be variously modified and changed from the above description by those skilled in the art to which the present invention pertains. Therefore, the scope and spirit of the present invention should be understood only by the following claims, and all of the equivalences and equivalent modifications to the claims are intended to fall within the scope and spirit of the present invention.

The invention claimed is:

1. A method for manufacturing a nonvolatile memory thin film device by using a neutral particle beam generation apparatus including a chamber, which is a plasma discharge space and has a predetermined size, a gas supply port for supplying gas to the inside of the chamber, and a reflector for colliding with plasma ions generated in the chamber so as to convert the plasma ions into neutral particles, the method comprising:

arranging, in the chamber, a substrate on which a first insulating film is formed;

supplying, through the gas supply port to the inside of the chamber,
hydrogen gas for generating a hydrogen plasma and an inert gas for generating an inert gas plasma;

generating hydrogen plasma ions and inert gas plasma ions in the chamber;

converting the hydrogen plasma ions into hydrogen neutral particles by colliding the hydrogen plasma ions with the reflector;

accumulating the hydrogen neutral particles on a surface of the first insulating film to form a mobile proton layer; and forming a second insulating film on the mobile proton layer.

2. The method of claim 1, wherein the reflector is a solid plate composed of a material having an atomic mass both greater than an inert hydrogen gas molecule; and
less than an inert molecule of the inert gas.

* * * * *